US007505963B1

(12) United States Patent
Fullam

(10) Patent No.: US 7,505,963 B1
(45) Date of Patent: Mar. 17, 2009

(54) METHOD AND SYSTEM FOR EFFICIENTLY SAVING AND RETRIEVING VALUES OF A LARGE NUMBER OF RESOURCE VARIABLES USING A SMALL REPOSITORY

(75) Inventor: Martin M. Fullam, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/970,037

(22) Filed: Jan. 7, 2008

(51) Int. Cl.
*G06F 7/00* (2006.01)

(52) U.S. Cl. ........................................................ 707/2

(58) Field of Classification Search ...................... 707/2
See application file for complete search history.

(56) References Cited

U.S. PATENT DOCUMENTS 5,842,021 A * 11/1998 Odani et al. ................ 717/159
6,247,076 B1 6/2001 Ono
6,704,844 B2 3/2004 Arimilli et al.
7,257,690 B1 * 8/2007 Baird ......................... 711/162
2005/0055363 A1 * 3/2005 Mather ....................... 707/102
2006/0130034 A1 * 6/2006 Beisiegel et al. ............ 717/166

* cited by examiner

*Primary Examiner*—Charles Rones
*Assistant Examiner*—Fazlul Quader
(74) *Attorney, Agent, or Firm*—Cantor Colburn LLP; Geraldine Monteleone

(57) ABSTRACT

Reducing memory and/or storage requirements of a repository in a resource variable value save and retrieve operation implemented in computer hardware and/or software is accomplished by minimizing the number of repository entries saved by creating and saving repository entries only for resource variables that have non-normal values, and by discarding repository entries when the values of the resource variables corresponding to those entries have returned to the normal value. The number of repository entries, at any point in time, is equal to the count of resource variables known to have non-normal values. Each repository entry includes a resource variable identifier and the value of the resource variable.

2 Claims, 3 Drawing Sheets

METHOD AND SYSTEM FOR EFFICIENTLY SAVING AND RETRIEVING VALUES OF A LARGE NUMBER OF RESOURCE VARIABLES USING A SMALL REPOSITORY

CROSS-REFERENCE TO RELATED APPLICATION

This application contains subject matter which is related to the subject matter of the following co-pending application which is assigned to the same assignee as this application, International Business Machines Corporation of Armonk, N.Y. The below listed application is hereby incorporated herein by reference in its entirety: U.S. patent application Ser. No. 11/696,306.

TECHNICAL FIELD

The present invention relates to computer data handling applications, where unlimited implementations in hardware, software or both are possible, where the implementations include, but are not limited to: event monitoring in systems management applications, data mining, pattern recognition, data analysis, data transcoding and data conversion. More particularly, the present invention relates to efficiently saving and retrieving the values of a large number of resource variables, when most of the large number of resource variables are expected to have the same value at any point in time.

BACKGROUND

Known methods and systems for recording large numbers of resource variable identifiers and their values require large memory and/or storage allocations, which increase costs and decrease performance of data handling solutions.

There are currently no solutions that provide a data handling solution that can track the values of a large number of resource variables, minimize memory and/or storage media allocations and associated costs, while increasing overall performance of the data handling solution.

SUMMARY OF THE INVENTION

A method and system are disclosed herein for efficiently saving and retrieving values of each one of a plurality of resource variables using a small repository, for use in associated computer data handling applications, systems and/or networks. The method and system are most efficient when most resource variables have the same value, herein called the 'normal' value, at any point in time.

The method of saving values is accomplished by obtaining a resource variable identifier (RVID) and its associated resource variable value (RVVAL), determining whether the resource variable value is normal or non-normal, making a change to the small repository if warranted, and proceeding to the save operation return. The method of saving dictates that a change to the small repository is warranted if it is determined that the obtained RVVAL is not the normal value, or is the normal value and an entry for the given RVTD already exists in the small repository. If the obtained RVVAL is non-normal, a resource variable entry is created in the small repository if no entry exists yet for the given RVID, or the resource variable's entry is updated if an entry already exists for the given RVID. A resource variable entry in the small repository includes a RVID and its RVVAL. Updates are accomplished by overwriting the RVVAL in the resource variable entry for the given RVID with the newly obtained RVVAL for the given RVID. If the obtained RVVAL, is normal, the resource variable entry for the given RVID, if such an entry exists, is deleted from the small repository.

The method of retrieving resource variable values is accomplished by obtaining a RVID, determining whether a resource variable entry for the RVID exists in the small repository, determining the value to return, and proceeding to the retrieve operation return. If the resource variable entry for the RVID does not exist in the small repository, then the return value is set to the normal value. In the alternative, if the resource variable entry for the RVID does exist in the small repository, then the return value is set to the RVVAL found in the resource variable entry for that RVID.

Thus, the useful, practical and concrete result of minimizing the required memory and/or storage allocation in the associated computer data handling applications, systems and/or networks in which the efficient saving and retrieving method and system are implemented is accomplished because by inventive design the algorithms conducting the operations of the efficient saving and retrieving method and system cause the memory and/or storage requirements of the small repository to be only as large as the sum of the memory and/or storage needed for resource variable entries for each of the resource variables with non-normal values. In addition, the size of the small repository is kept small by pruning resource variable entries from the small repository when it is determined that the values of the corresponding resource variables have returned to the normal value.

The above-described and other features will be appreciated and understood by those skilled in the art from the following detailed description, drawings, and appended claims.

DETAILED DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings, which are meant to be exemplary, and not limiting, wherein:

DETAILED DESCRIPTION

The exemplary embodiment of the invention is described below in detail. The disclosed exemplary embodiment is intended to be illustrative only, since numerous modifications and variations therein will be apparent to those of ordinary skill in the art. In reference to the drawings, like numbers will indicate like parts continuously throughout the view. Further, the terms "a", "an", "first", "second" and "third" herein do not denote a limitation of quantity, but rather denote the presence of one or more of the referenced item.

Figure 1:
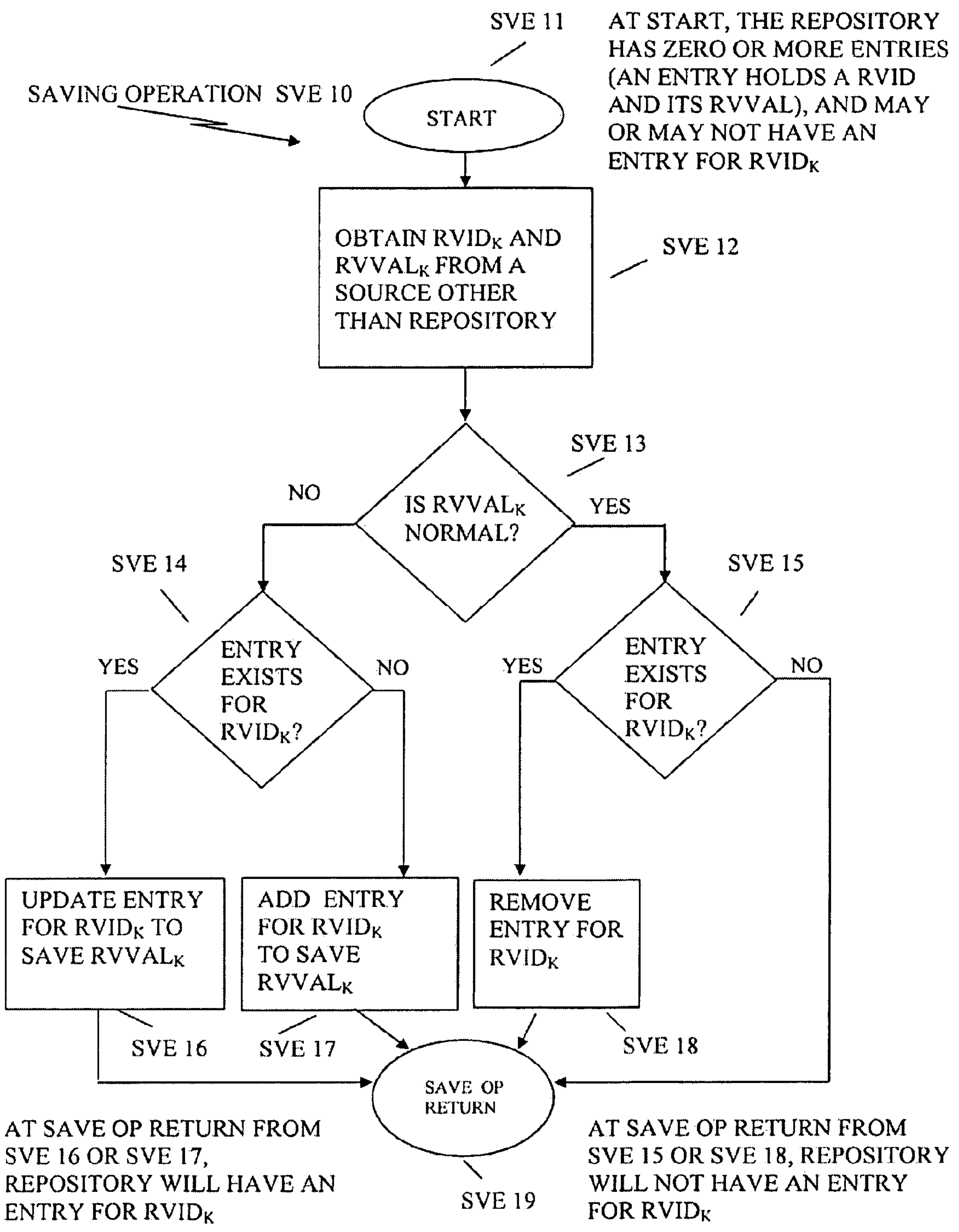
FIG. 1 illustrates an operation for carrying out an exemplary embodiment of efficiently saving resource variable values.
Figure 2:
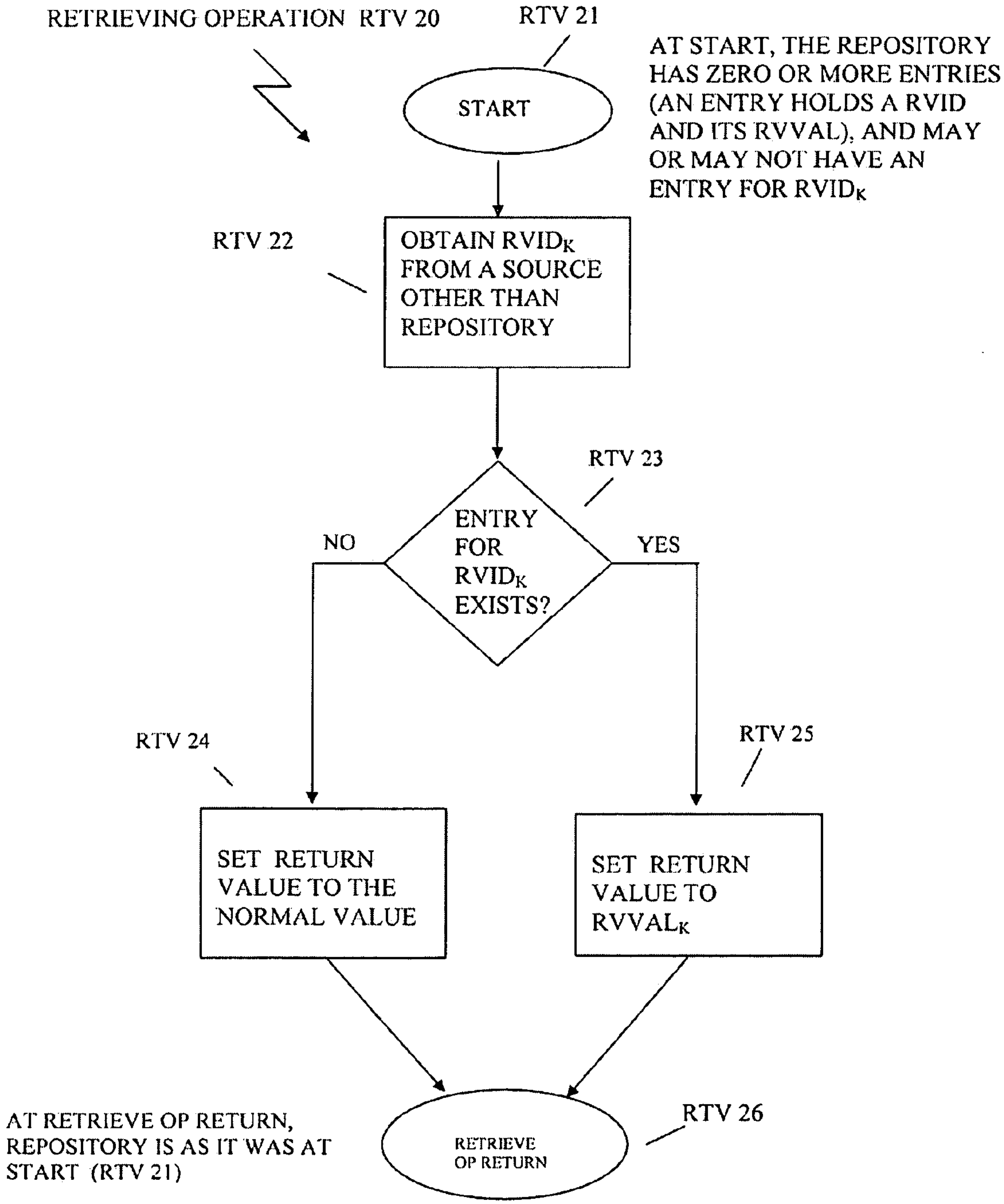
FIG. 2 illustrates an operation for carrying out the exemplary embodiment of efficiently retrieving resource variable values.
Figure 3:
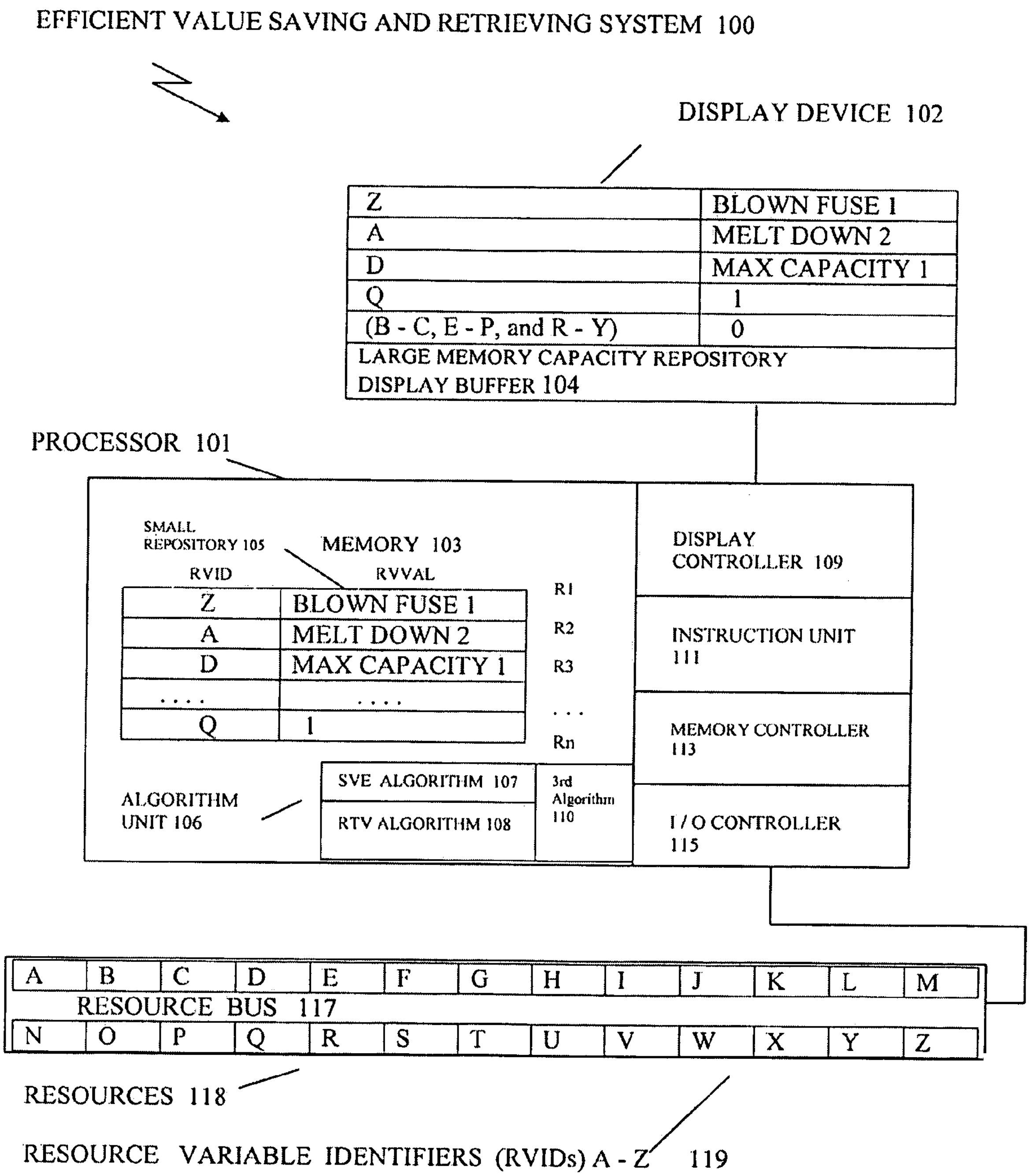
FIG. 3 illustrates the system implementation of the exemplary embodiment of efficient value saving and retrieving using small repository 105.

The exemplary embodiment will be understood by referring to FIGS. 1 through 3. A process of saving resource variable values in operation SVE 10 is illustrated in FIG. 1 and a process of retrieving resource variable values in operation RTV 20 is illustrated in FIG. 2; these operations are implemented in the efficient value saving and retrieving system 100, illustrated in FIG. 3.

Referring to FIG. 3, the efficient value saving and retrieving system 100 includes processor 101 having display controller 109, instruction unit 111, input/output controller 115, memory 103 and memory controller 113. A group of resources 118 (which represent either physical or logical resource devices, such as hard drives) designated by resource variable identifiers A through Z 119 are coupled electrically and in communication with input/output controller 115 of processor 101 by way of resource bus 117. Display device 102 is connected to and is in electrical communication with processor 101 by way of display controller 109. Display device 102 includes a visual display where outputs generated by SVE algorithm 107, RTV algorithm 108 or third algorithm 110 are displayed, and where the outputs displayed represent the contents of a large memory capacity repository display buffer 104.

Memory 103 contains small repository 105. Small repository 105 contains repository entry locations R1 through Rn, where small repository 105 is characterized as being small, as compared to repositories used by known methods and systems for recording large numbers of values and their resource variable identifiers, which require large memory and/or storage allocations and which increase costs and decrease performance of data handling solutions. In addition, in the exemplary embodiment, the small repository 105 would be capable of holding a plurality of resource variable entries consisting of resource variable identifiers (RVIDs) and their non-normal values (RVVALs). However, small repository 105 is smaller in size than a repository sized to hold all of the possible resource variable identifiers and their associated normal or non-normal values, where the size of the small repository is measured in terms of number of entries of repository entry locations R1 through Rn. Small repository 105 is flexible and at any point in time can be contracted or expanded to contain "n" entries, where "n" is determined by calculating the sum of the number of RVVALs known to have a non-normal value. Thus, as illustrated in FIG. 3, representing a point in time, small repository 105 is expanded to repository entry location "Rn", where:

n=(SUM Number of Known RVVALs with Value Non-norm); thus n=(SUM of Z+A+D+Q); thus n=4; thus, in this example at a given point in time, the small repository is expanded to contain 4 entries, each accommodating a RVID and its RVVAL, where the RVVAL is a non-normal value.

Memory 103 also contains algorithm unit 106, where first, second and third algorithms SVE algorithm 107, RTV algorithm 108 and third algorithm 110 respectively reside and are executed by processor 101 and cause processor 101 to perform various operations. SVE algorithm 107 is programmed to perform saving operation SVE 10. RTV algorithm 108 is programmed to perform retrieving operation RTV 20 and third algorithm 110 is programmed to perform other operations including display and network control operations.

Referring to FIG. 1, at start SVE 11 of saving operation SVE 10, small repository 105 will have zero or more entries, and may or may not have an entry for $RVID_K$. In first obtaining sub operation SVE 12, $RVID_K$ (one of the plurality of RVIDs being tracked) and its associated value $RVVAL_K$ are obtained from a source other than small repository 105 and inspected. First determining sub operation SVE 13 is conducted to determine whether $RVVAL_K$ is normal or non-normal. In the exemplary embodiment, the value can be represented by any data type including but not limited to alphanumeric data (in machine or human-readable form), digital audio and/or video data, and compiled computer code. Second determining sub operation SVE 14 is conducted to determine whether an entry exists for $RVID_K$ in small repository 105, where small repository 105 is composed of "Rn" distinct entries, as shown by R1 through Rn, where "n" is less than or equal to the number of resource variables being tracked in the universe of RVIDs A-Z 119 and each repository entry location holds a given RVID that has a non-normal value and that non-normal value. Any RVID will appear at most once in small repository 105. In the exemplary embodiment, FIG. 3 represents the small repository 105 after the method illustrated in FIG. 1 has been run for every resource represented by RVIDs A through Z in a polling mode and RVIDs Z, A, V and Q were determined to have non-normal values or FIG. 3 can also represent a mode where an interrupt notified the system that Z, A, D and Q were the only RVIDs determined to have non-normal values, which were mapped to the following value representations in human readable form of alpha-numeric character strings indicating "BLOWN FUSE 1", "MELT DOWN 2", "MAX CAPACITY 1", and "1" for Z, A, D and Q respectively. Thus, in both the polling and interrupt modes, only RVIDs Z, A, D and Q were determined to have non-normal values.

Each algorithm, i.e., SVE algorithm 107, RTV algorithm 108 and third algorithm 110 operates on its own timing schedule. For example, RTV algorithm 108 operating under its independent timing schedule in system 100 may make an inquiry about the value of a resource represented by $RVID_K$; therefore, algorithm 108 wants to know what is in small repository 105, because the contents of small repository 105 are useful in making determinations about performing other operations related to the resource represented by $RVID_K$ which is currently located in small repository 105, where SVE algorithm 107 operating on its own independent timing schedule keeps track of RVIDs and their current values in small repository 105 of system 100.

One example of how this exemplary embodiment can be used is associated with event monitoring of each resource in a plurality of resources. A resource could be a physical resource or a logical resource associated with a computer network. A hard disc drive is an example of a physical resource that is connected in a computer network and monitored by systems management software. Thus, the designation resource variable identifier is a variable name in terms of software programming. For example, when software programs are written, variable names (also referred to as "variable identifiers"), are designated.

Another example of how this exemplary embodiment can be used is associated with tracking business events of a plurality of consumers, producers and/or providers. Thus, a resource variable identifier can identify people "Marty" and "John" and/or organizations. If it is known that "John" spends and/or sells a dollar amount of $18 dollars a month in regard to certain items and Marty spends and/or sells $24 dollars a month for the same items, then the value associated with RVID "John" is a value of "$18" and the value associated with RVID "Marty" is "$24" can be considered non-formal values. Furthermore, any value below $10 can be considered not worth tracking and would equate to a normal value.

Referring to FIG. 3, the resource variable identifier Z corresponds to a particular resource of interest in regard to tracking the state value status by the event monitoring software. Thus, Z is the resource variable identifier used in the software algorithm to map to a hard disc drive device of interest to be monitored. Therefore, the hard disc drive is the actual resource and Z is the resource variable identifier of the hard disc drive resource. Thus, in this example, Z is a variable in the software sense used to represent a resource which is selected as a physical hard disc drive connected to the computer network via resource bus 117. In a broader sense, the resource variable identifiers A-Z 119 represent 26 various logical or physical resources assigned logically or connected physically to any computers or computer processors or computer systems in the computer network that is to be monitored by the event monitoring software.

In FIG. 1, first determining sub operation SVE 13 determines whether the value (i.e., $RVVAL_K$) of $RVID_K$ is normal or non-normal. Second determining sub operation SVE 14 determines whether an entry exists for $RVID_K$ in small repository 105, when the value (i.e., $RVVAL_K$) of $RVID_K$ is non-normal. A third determining sub operation SVE 15 determines whether an entry exists for $RVID_K$ in small repository 105, when the value of $RVID_K$ is normal.

If it is determined in the second determining sub operation SVE 14 that the entry does exist for $RVID_K$ in small repository 105, when the value is non-normal, then first performing sub operation SVE 16 updates the entry for $RVID_K$ by overwriting the saved value with $RVVAL_K$. After the entry is updated, saving operation SVE 10 proceeds to saving operation (save op) return SVE 19. Or, if the entry does not exist for $RVID_K$ in small repository 105, when the value of $RVID_K$ is non-normal, then second performing sub operation SVE 17 adds an entry for $RVID_K$ (consisting of $RVID_K$ and $RVVAL_K$) to small repository 105. After the entry is added, saving operation SVE 10 proceeds to save op return SVE 19.

If it is determined in third determining sub operation SVE 15 that the entry does not exist for $RVID_K$ in small repository 105, when the value is normal, then saving operation SVE 10 proceeds to save op return SVE 19. Or, if it is determined that the entry does exist for $RVID_K$ in small repository 105, when the value of $RVID_K$ is normal, then third performing sub operation SVE 18 removes the entry for $RVID_K$ from small repository 105, where removing the repository entry of $RVID_K$ keeps the repository small by eliminating entries corresponding to RVIDs that have the normal value. After the entry is removed, saving operation SVE 10 proceeds to save op return SVE 19. Thus, by literally recording in small repository 105 only entries corresponding to RVIDs that have non-normal values, the method and system of saving also distinguish and virtually record entries corresponding to RVIDs that have normal values; thereby, recording by not recording the distinguished RVIDs with normal values. Therefore, by design, SVE algorithm 107 keeps track of all of the RVIDs and their values, even though only entries corresponding to RVIDs with non-normal values need to be recorded in small repository 105 and by design, SVE 18 keeps the repository as small as possible by pruning entries corresponding to RVIDs with normal values. SVE algorithm 107 is also programmed to know that the remaining RVIDs, i.e., RVIDs B-C, E-P and R-Y each have the normal value.

Referring to FIG. 2, the method of retrieving operation RTV 20 comprises the following sub operations RTV 21 through RTV 26, performed by RTV algorithm 108: At start RTV 21, repository 105 will have zero or more entries, and may or may not have an entry for $RVID_K$. Second obtaining sub operation RTV 22 is conducted to obtain $RVID_K$, a resource of interest from the universe of resources being tracked, from a source other than small repository 105. Fourth determining sub operation RTV 23 is conducted to determine whether an entry exists in small repository 105 for $RVID_K$.

If it is determined in fourth determining sub operation RTV 23 that an entry does not exist in small repository 105 for $RVID_K$, then fourth performing sub operation RTV 24 sets the return value to the normal value and then, retrieving operation RTV 20 proceeds to retrieving operation (retrieve op) return RTV 26. In the alternative, if it is determined that an entry does exist in small repository 105 for $RVID_K$, then fifth performing sub operation RTV 25 sets the return value to $RVVAL_K$ and then retrieving operation RTV 20 proceeds to retrieve op return RTV 26.

Setting a return value relates to calling an algorithm, a subroutine or a utility, and the return value is returned in the software sense by RTV algorithm 108 to set either the normal value or a non-normal value which could be of any data type that the algorithms are capable of handling.

After the above described save op return SVE 19 and retrieve op return RTV 26 values have been set, values from saving operation SVE 10 and retrieving operation RTV 20 can be used in third algorithm 110 called to perform additional operations and/or sub operations. For example, third algorithm 110 can cause any of the above operations and sub operations to be repeated or cause set values to be streamed to display device 102 (as illustrated in FIG. 3) or streamed to instruction unit 111, where such data are used to generate instructions to control additional data handling operations in computer data handling event monitoring applications.

Thus, the useful, practical and concrete result of minimizing the required memory and/or storage allocation of small repository 105 is accomplished because by inventive design SVE algorithm 107, RTV algorithm 108 and third algorithm 110 conducting the operations of the efficient saving and retrieving method and system cause the memory and/or storage size of small repository 105 to be only as large as the sum of the memory and/or storage needs of repository entries for RVIDs with non-normal values. Also, the memory and/or storage size of small repository 105 is decreased further because SVE algorithm 107, RTV algorithm 108 and third algorithm 110 by design are programmed to know by default that any RVIDs not recorded each have the normal value; therefore, once it is determined by the algorithms whether the values are either normal or non-normal, it is not required to record any of the normal values in small repository 105. In addition, the size of the small repository is kept small by pruning RVIDs with normal values.

The disclosure has been described with reference to the exemplary embodiment, where for example, a resource variable identifier and its value can be represented by any name or any value.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

In addition, many modifications may be made to adapt a particular situation or material to the teachings of the disclosure without departing from the essential scope thereof. For example, the method of saving and retrieving can be carried out by at least polling and/or interrupt operations. It will be understood by those skilled in the art that various changes may be made and equivalents may be substituted for elements thereof without departing from the scope of the disclosure. Therefore, it is intended that the disclosure not be limited to any one particular embodiment disclosed as the best mode contemplated for carrying out this disclosure, but that the disclosure will include all embodiments falling within the scope of the appended claims.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method, implemented in a computer system, minimizing memory requirements of a resource variable value: save and retrieve operation, wherein the computer system contains a computer processor including a computer readable storage medium containing computer executable code that when executed by the computer processor causes the computer processor to perform the method comprising:

minimizing one of hardware and software memory storage requirements of the resource variable value save and retrieve operation by:

minimizing a number of repository entries required to be saved in the resource variable value save and retrieve operation by creating and saving repository entries only for resource variables that have non-normal values, wherein the computer readable storage medium includes a small repository containing a plurality of repository entry locations;

pruning repository entries of resource variables and values of resource variables by removing repository entries of resource variables from the small repository, when values of resource variables have returned to a normal value, wherein a size of the small repository is measured in terms of the number of repository entries required to be saved in the resource variable value save and retrieve operation, wherein the number of repository entries is equal to a summation of resource variable identifiers of a plurality of resource variables known to have non-normal values, and wherein the number of repository entries is calculated by:

number of repository entries=(SUM Number of Known RVVALs with Value Non-norm), wherein each repository entry includes a resource variable identifier and a value of the resource variable;

saving values of resource variables by one of adding an entry to the repository for a resource variable with a non-normal value if no entry yet exists for the resource variable, and updating the entry to the repository for the resource variable with the non-normal value if the entry already exists for the resource variable, and adding no entry to the repository for a resource variable with a normal value if no entry yet exists for the resource variable with the normal value, and removing the repository entry for the resource variable with the normal value if the entry already exists for the resource variable with the normal value; and retrieving values of resource variables by one of returning a value found in the repository for a resource variable and returning a normal value for the resource variable when the resource variable is not present in the repository.

2. The method of claim 1, wherein values of resource variables saved are one or more of a data type including alphanumeric data in one of machine and human readable form, digital data, audio data, video data and compiled computer code.

* * * * *